(12) United States Patent  
Kawamura et al.

(10) Patent No.: US 8,653,517 B2
(45) Date of Patent: Feb. 18, 2014

(54) THIN-FILM TRANSISTOR AND METHOD FOR MANUFACTURING THE SAME

(75) Inventors: Tetsufumi Kawamura, Kodaira (JP); Hiroyuki Uchiyama, Musashimurayama (JP); Hironori Wakana, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/639,455

(22) PCT Filed: Apr. 1, 2011

(86) PCT No.: PCT/JP2011/058436
§ 371 (c)(1),
(2), (4) Date: Nov. 2, 2012

(87) PCT Pub. No.: WO2011/125940
PCT Pub. Date: Oct. 13, 2011

(65) Prior Publication Data
US 2013/0043469 A1    Feb. 21, 2013

(30) Foreign Application Priority Data
Apr. 6, 2010 (JP) .................................. 2010-087808

(51) Int. Cl.
*H01L 29/786* (2006.01)
(52) U.S. Cl.
USPC .............. 257/43; 257/E29.273; 257/E21.409; 438/197
(58) Field of Classification Search
USPC .............................. 257/43, E29.273, E21.409
See application file for complete search history.

(56) References Cited

U.S. PATENT DOCUMENTS

| 8,350,261 B2 * | 1/2013 | Sakata et al. ................... 257/43 |
| 2008/0237598 A1 | 10/2008 | Nakayama |
| 2009/0294765 A1 | 12/2009 | Tanaka et al. |
| 2011/0256684 A1 | 10/2011 | Iwasaki et al. |

FOREIGN PATENT DOCUMENTS

| JP | 2007-250983 A | 9/2007 |
| JP | 2008-205451 A | 9/2008 |
| JP | 2009-32840 A | 2/2009 |
| JP | 2009-212476 A | 9/2009 |
| JP | 2009-212497 A | 9/2009 |
| JP | 2009-266938 A | 11/2009 |
| JP | 2009-290113 A | 12/2009 |

OTHER PUBLICATIONS

International Search Report with English translation dated May 10, 2011 (four (4) pages).

* cited by examiner

*Primary Examiner* — Zandra Smith
*Assistant Examiner* — Paul Patton
(74) *Attorney, Agent, or Firm* — Crowell & Moring LLP

(57) ABSTRACT

In a TFT that adopts an oxide semiconductor as an active layer and has a resistance layer interposed between the active layer and one of a source and drain electrode, while Vth close to 0 V and a small off current are sustained, an on-current is increased. In a thin-film transistor including a gate electrode, a gate insulating film, a semiconductor layer, a source electrode, and a drain electrode, the semiconductor layer that links the source electrode and drain electrode is made of a metal oxide. The semiconductor layer includes three regions of first, second, and third regions. The first region is connected with the source electrode, the third region is connected with the drain electrode, and the second region is connected between the first region and third region. The resistivities of the three regions have the relationship of the first region>the second region>the third region.

11 Claims, 19 Drawing Sheets

THIN-FILM TRANSISTOR AND METHOD FOR MANUFACTURING THE SAME

TECHNICAL FIELD

The present invention relates to a semiconductor unit, or more particularly, to a semiconductor unit that includes a field-effect thin-film transistor which adopts a metal oxide film as a channel layer, and a manufacturing method for the semiconductor unit.

BACKGROUND ART

A thin-film transistor (hereinafter, may be referred to as a TFT in this specification) is a device that can be formed on an insulator substrate made of glass or the like and plays a pivotal role in electronics technology. As a channel layer material for the TFT, an amorphous silicon or polycrystalline silicon is currently most widely adopted. In recent years, a metal oxide semiconductor (hereinafter, may be referred to as an oxide semiconductor or oxide in this specification) has attracted attention as a substitute for the silicon material. The oxide semiconductor TFT has such features that the oxide semiconductor TFT can permit flow of a larger current than an amorphous silicon TFT can, is less costly than a polycrystalline silicon TFT is, and can be manufactured with a minimal variance in properties from other devices. In addition, not only the property of the oxide semiconductor TFT as the channel layer is excellent but also the oxide semiconductor TFT has a feature that it can be formed at temperature close to room temperature. Therefore, the oxide semiconductor is regarded as one of promising candidates for the channel layer material to be employed when a TFT is formed on a so-called flexible substrate such as a plastic film.

In next-generation TFT-use devices, a TFT that is superb in a property of permitting flow of a large current is requested to be manufactured on a large area at a low cost with a minimal variance in the property. A problem is that although an existing oxide semiconductor TFT has an advantage over a silicon TFT in several points, a current value to be fed by the oxide semiconductor TFT is poorer than that to be fed by a polycrystalline silicon TFT.

An oxide semiconductor TFT that has addressed the above problem is disclosed in Patent Literature 1, A disclosed structure is characterized by the adoption of an oxide semiconductor, which exhibits a low resistance, as an active layer (channel layer) and the inclusion of a resistance layer between the active layer and at least one of a source electrode and drain electrode. Owing to the structure, both a large on current and a small off current are attained.

CITATION LIST

Patent Literature

Patent Literature 1: Japanese Patent Application Laid-Open Publication No. 2009-212497

SUMMARY OF INVENTION

Technical Problem

In Patent Literature 1, as mentioned above, a resistance layer is interposed between at least one of a source electrode and drain electrode and an active layer in order to improve TFT properties. For example, when the resistance layer is interposed only between the source electrode and active layer (see FIG. 12), assuming that Vd denotes a drain voltage, Rsc denotes a source electrode-side contact resistance, Rs denotes a resistance of a source electrode neighboring resistance layer, Rch denotes a channel resistance, and Rdc denotes a drain electrode-side contact resistance, the on current (Ion) is expressed as a formula (1) below.

$$\text{Ion} = Vd/(Rsc + Rs + Rch + Rdc) \tag{1}$$

By the way, in the TFT that adopts an oxide semiconductor, which is an n-type semiconductor, as the resistance layer and active layer, when a total quantity of carriers in the resistance layer and active layer in a B region shown in FIG. 12 is fully decreased due to an electric field from a gate electrode (when a resistance is fully increased), the TFT enters an off state. A threshold of a gate voltage causing this transition is a threshold voltage (Vth) of the TFT, and Vth satisfies a formula (2) below.

$$-q(N_1 \cdot t_1 + N_2 \cdot t_2) = \epsilon_r \cdot \epsilon_0 \cdot (Vth - Vfb)/t \tag{2}$$

Herein, $N_1$ and $t_1$ denote a carrier concentration of the resistance layer and a film thickness thereof respectively, and $N_2$ and $t_2$ denote a carrier concentration of the active layer and a film thickness thereof respectively. Further, q denotes a quantum of electricity, $\epsilon_r$ denotes a relative permittivity of a gate insulating film, $\epsilon_0$ denotes a permittivity in vacuum, t denotes a thickness of the gate insulating film, and Vfb denotes a flat band voltage. Therefore, $q \cdot N_1 \cdot t_1$ in the formula (2) expresses a quantity of carriers in the resistance layer in the region B, $q \cdot N_2 \cdot t_2$ expresses a quantity of carriers in the active layer in the region B, and (Vth−Vfb)/t expresses an electric field in the gate insulating film. Further, a sign in the left side signifies that carriers are electrons.

By deforming the formula (2), Vth is written as a formula (3) below.

$$Vth = -q(N_1 \cdot t_1 + N_2 \cdot t_2) \cdot t/\epsilon_r/\epsilon_0 + Vfb \tag{3}$$

In order to increase the on current, the resistive components in the formula (1) should be diminished. However, when an attempt is made to simply diminish Rsc, Rs, and Rch, $N_1 \cdot t_1$ (which can be approximated to $\propto 1/(Rsc+Rs)$) and $N_2 \cdot t_2$ (which can be approximated to $\propto 1/Rch$) have to be increased. This depletes Vth. Namely, the structure disclosed in Patent Literature 1 is confronted with a problem that it is hard to increase the on current while sustaining Vth close to 0 V and a small off current.

The present invention addresses the foregoing situation, and an object of the invention will be described below. Specifically, the object is to increase the on current while sustaining Vth close to 0 V and a small off current in a TFT that adopts an oxide semiconductor as an active layer (channel layer) and has a resistance layer interposed between the active layer and one of a source electrode and drain electrode.

Solution to Problem

A typical one of inventions to be disclosed in this application will be briefly outlined below.

Specifically, in a thin-film transistor having a gate electrode, a gate insulating film, a semiconductor layer, a source electrode, and a drain electrode, the semiconductor layer that links the source electrode and drain electrode is made of a metal oxide, and the semiconductor layer includes three regions of first, second and third regions. The first region is connected with the source electrode, the third region is connected with the drain electrode, and the second region is connected between the first and third regions. The resistivities of the three regions have the relationship of the first region>the second region>the third region.

According to the foregoing constitution, the aforesaid problem can be addressed. Specifically, while a small off current is sustained with Vth held close to 0 V, an on current can be further increased. A reason why the Vth close to 0 V and large on current can be attained by the present invention will be described below.

In order to increase an on current Ion without affecting Vth, Rdc in the formula (1) should be made as small as possible. For this purpose, a semiconductor layer that links a source electrode and drain electrode is divided into three regions of a first region that is connected with the source electrode, a third region that is connected with the drain electrode, and a second region that is connected between the first and third regions. The resistivity of the third region is made as low as possible.

Next, diminishing Rsc+Rs+Rch will be discussed below.

Herein, as shown in FIG. 12, Rsc is defined as a source electrode-side contact resistance, Rs is defined as a resistance of a source electrode neighboring resistance layer, Rch is defined as a channel resistance, and Rdc is defined as a drain electrode-side contact resistance.

To begin with, a case where Vth in the formula (3) is positive will be discussed. In order to make Vth smaller than a certain voltage V1 (positive value) (closer to zero), a formula (4) below has to be satisfied.

$$V1>Vth=-q(N_1 \cdot t_1+N_2 \cdot t_2) \cdot t/\epsilon_r/\epsilon_0+Vfb>0 \quad (4)$$

Further, when the formula (4) is deformed, a formula (5) is obtained.

$$(Vfb-V1) \cdot \epsilon_0/t/q<N_1 \cdot t_1+N_2 \cdot t_2<Vfb \cdot \epsilon_r \cdot \epsilon_0/t/q \quad (5)$$

In order to obtain a maximum on current Ion according to the formula (1), Rsc+Rs+Rch should be minimized. Since a majority of a path along which carriers flow lies in an active layer, Rch out of the three components should be minimized as a top priority. Since Rch can be approximated according to Rch $\propto 1/N_2 \cdot t_2$, when Rch is diminished, $N_2 \cdot t_2$ gets larger. Accordingly, $N_1 \cdot t_1$ is diminished in order to satisfy the formula (5). In other words, when Rch is fully diminished, $N_1 \cdot t_1 < N_2 \cdot t_2$ is attained. This leads to the resistivity of the first region>the resistivity of the second region. At this time, Ion is maximized.

A case where Vth in the formula (3) is negative will be discussed below. In order to make Vth larger than a certain voltage -V1 (close to zero), a formula (6) below has to be satisfied.

$$-V1<Vth=-q(N_1 \cdot t_1+N_2 \cdot t_2) \cdot t/\epsilon_r/\epsilon_0 Vfb>0 \quad (6)$$

Further, when the formula (6) is deformed, a formula (7) below is obtained.

$$Vfb \cdot \epsilon_r \cdot \epsilon_0/t/q<N_1 \cdot t_1+N_2 \cdot t_2<(Vfb+V1) \cdot \epsilon_r \cdot \epsilon_0/t/q \quad (7)$$

According to the formula (7), even in the case where Vth is negative, similarly to the case where Vth is positive, when $N_1 \cdot t_1 < N_2 \cdot t_2$ is attained, that is, when the resistivity of the first region>the resistivity of the second region is attained, Ion is maximized.

Accordingly, when the resistivities of the three regions have the relationship of the first region>the second region>the third region, the on current Ion is maximized under the condition of |Vth|<V1 (voltage close to zero).

Advantageous Effects of Invention

An advantageous effect provided by a typical one of inventions disclosed in this application will be briefly described below.

Specifically, in a TFT that adopts an oxide semiconductor as a channel layer, Vth close to 0 V, a small off current, and a large on current can be attained concurrently.

DESCRIPTION OF EMBODIMENTS

First Embodiment

Figure 1:
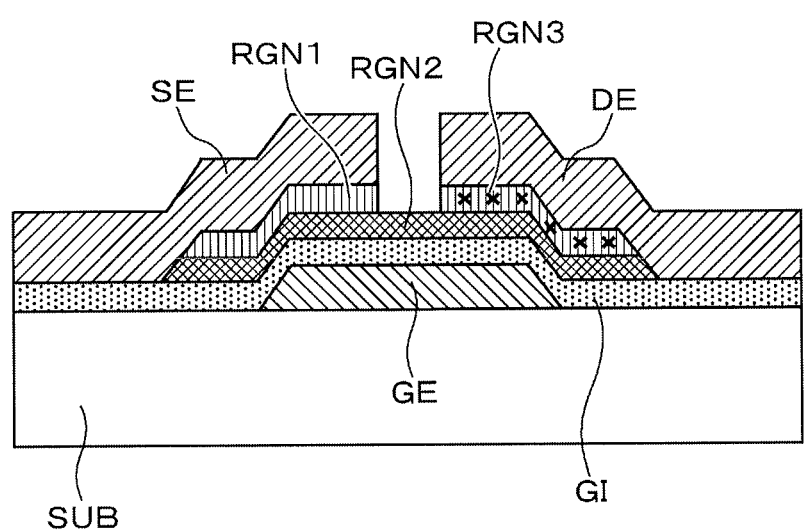
FIG. 1 is a sectional view showing a constitution of a semiconductor unit in accordance with a first embodiment of the present invention.

FIG. 1 is a diagram showing a constitution of a thin-film transistor in accordance with a first embodiment. As the thin-film transistor, a so-called bottom gate/top contact oxide TFT is cited. What is referred to as a bottom gate is a structure having a gate electrode GE formed in a layer lower than a semiconductor layer (RGN1, RGN2, and RGN3 in FIG. 1). What is referred to as a top contact is a structure having a source electrode SE and drain electrode DE formed in a layer upper than the semiconductor layers.

In a semiconductor layer that links a source electrode and a drain electrode, three regions of a first region RGN1, a second region RGN2, and a third region RGN3 are included. The first region RGN1 is connected with the source electrode, the third region RGN3 is connected with the drain electrode, and the second region RGN2 is connected between the first region RGN1 and third region RGN3. The first region RGN1 and third region RGN3 are formed with the same oxide semiconductor film, and the third region RGN3 is formed by performing resistivity lowering treatment on the film. In addition, the regions are formed on the second region RGN2 formed with an oxide semiconductor film. The resistivities of the three regions have the relationship of the first region RGN1>the second region RGN2>the third region RGN3. As for the resistivities, more particularly, the resistivity of the first region RGN1 is equal to or higher than $10^1$ Ωcm and falls below $10^7$ Ωcm, the resistivity of the second region RGN2 is equal to or higher than $10^{-3}$ Ωcm and falls below $10^2$ Ωcm, and the resistivity of the third region RGN3 falls below the resistivity of the second region RGN2. Alternatively, the regions may be specified with carrier concentrations. In this case, the carrier concentration of the first region RGN1 is equal to or higher than $10^{12}$ cm$^{-3}$ and falls below $10^{18}$ cm$^{-3}$, the carrier concentration of the second region RGN2 is equal to or higher than $10^{16}$ cm$^{-3}$ and falls below $10^{21}$ cm$^{-3}$, and the carrier concentration of the third region RGN3 is higher than that of the second region RGN2.

Figure 2A:
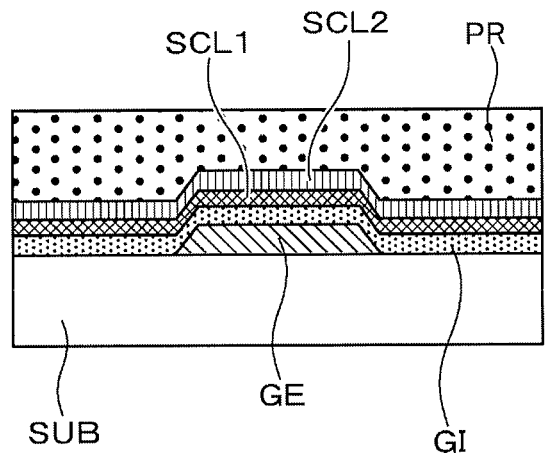
FIG. 2A is a sectional view showing a manufacturing method for the semiconductor unit in accordance with the first embodiment of the present invention.

FIG. 2A to FIG. 2L are diagrams showing a manufacturing method for the semiconductor unit in accordance with the first embodiment. To begin with, a gate electrode GE, gate insulating film GI, semiconductor layer 1 SCL1, semiconductor layer 2 SCL2, and photoresist PR are formed on an insulator substrate SUB (FIG. 2A). The substrate SUB is made of, for example, glass, quartz, or plastic film. The surface of the substrate SUB on a side thereof on which the gate electrode GE is formed is, if necessary, coated with an insulating film.

The gate electrode GE is formed with a single film made of a conducting material, for example, molybdenum, chromium, tungsten, aluminum, copper, titanium, nickel, tantalum, silver, zinc, or any other metal, an alloy film made of any of the materials, or a laminated film formed with any of the single films, a metal oxide conductive film made of ITO (indium tin oxide In—Sn—O) or the like or a laminated film formed with the metal oxide conductive film and a metal, a metal nitride conductive film made of titanium nitride (Ti—N) or the like or a laminated film formed with the metal nitride conductive film and a metal, a compound film made of any other conductive metals or a laminated film formed with the compound film and a metal, or a semiconductor that contains carriers at a high concentration or a laminated film formed with the semiconductor and a metal. The film formation is achieved according to a chemical vapor deposition (CVD) method or sputtering method. Processing is achieved with a combination of typical photolithographic technology and dry etching or wet etching.

As the gate insulating film GI, preferably, an oxide insulating film made of Si—O or Al—O is adopted. An inorganic insulating film made of Si—N or the like other than an oxide or an organic insulating film made of parylene may be adopted. Forming the gate insulating film GI is achieved according to the CVD method, sputtering method, or coating method.

The semiconductor layer 1 SCL1 and semiconductor layer 2 SCL2 is made of an oxide of any of Zn, In, Ga, and Sn such as Zn—O, In—O, Ga—O, Sn—O, In—Ga—Zn—O, Zn—Sn—O, In—Sn—O, In—Zn—O, Ga—Zn—O, In—Ga—O, or Al—Zn—O, or a complex oxide of any of these oxides. Forming the semiconductor layers is achieved according to the sputtering method, pulsed laser deposition (PLD) method, CVD method, coating method, or printing method. The thickness of the semiconductor layer 1 SCL1 and semiconductor layer 2 SCL2 is preferably 5 nm or more. Insular shaping processing to be performed on the semiconductor layer 1 SCL1 and semiconductor layer 2 SCL2 for the purpose of device separation is achieved with a combination of typical photolithographic technology and wet etching or dry etching. Further, an etch rate for a wet etching solution made of an inorganic acid or organic acid is lower in the semiconductor layer 1 SCL1 than in the semiconductor layer 2 SCL2. In order to produce a difference in the etch rate, for example, a method of making an Sn concentration in the semiconductor layer 1 SCL1 higher than that in the semiconductor layer 2 SCL2 is adopted. As the combination of the semiconductor layer 1 SCL1 and semiconductor layer 2 SCL2, various combinations of any of the aforesaid materials are conceivable. For example, the combination of the semiconductor layer 1 SCL1 made of In—Sn—O and the semiconductor layer 2 SCL2 made of In—Ga—Zn—O or Zn—O is preferred. As the method for making the Sn concentration in the semiconductor layer 1 SCL1 higher than that in the semiconductor layer 2 SCL2, a method of making the Sn concentration of a raw material, which is used to form the semiconductor layer 1 SCL1, higher than that of a raw material to be used to form the semiconductor layer 2 SCL2 is adopted. For example, when both the layers are formed using the sputtering method or PLD method, the Sn concentration in a target for the semiconductor layer 1 SCL1 is made higher than that in a target for the semiconductor layer 2 SCL2. Otherwise, only when the semiconductor layer 1 SCL1 is formed, the Sn targets may be placed simultaneously.

Figure 2B:
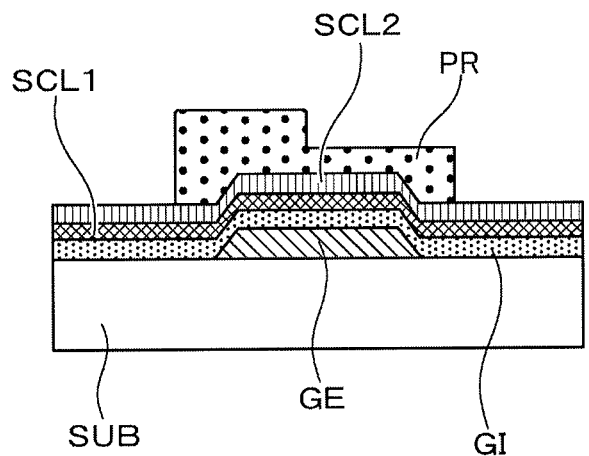
FIG. 2B is a sectional view showing the manufacturing method for the semiconductor unit in accordance with the first embodiment of the present invention.
Figure 2C:
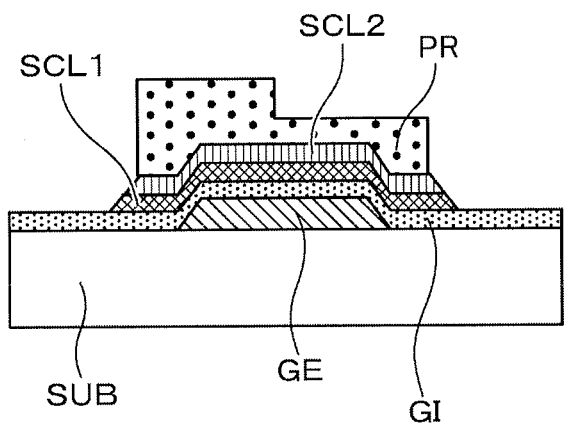
FIG. 2C is a sectional view showing the manufacturing method for the semiconductor unit in accordance with the first embodiment of the present invention.
Figure 2D:
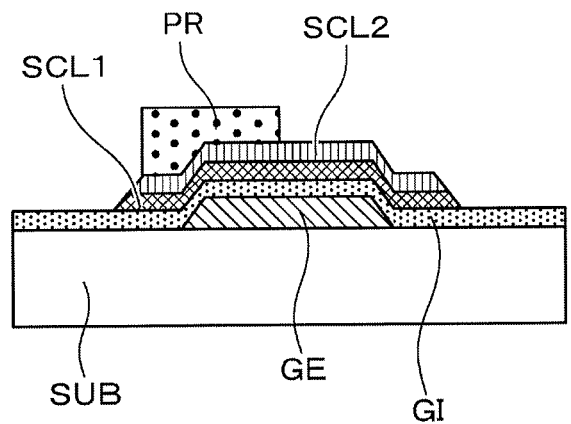
FIG. 2D is a sectional view showing the manufacturing method for the semiconductor unit in accordance with the first embodiment of the present invention.
Figure 2E:
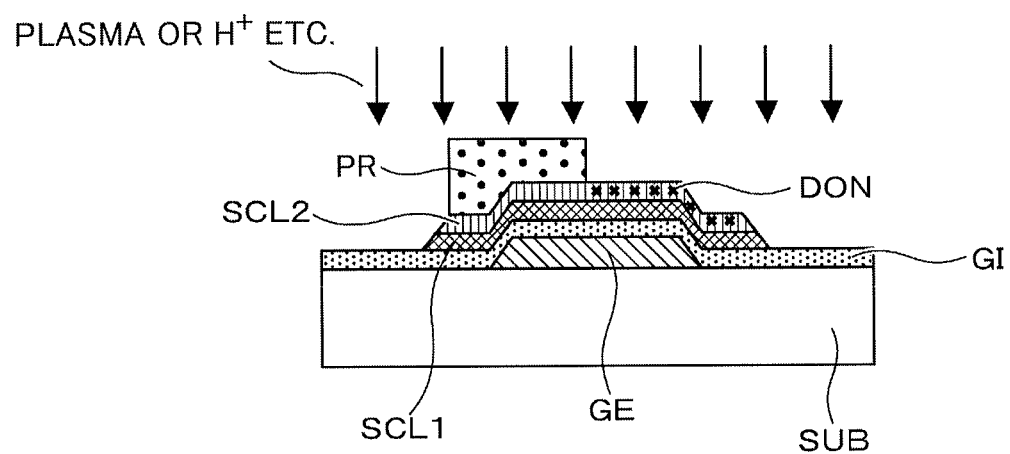
FIG. 2E is a sectional view showing the manufacturing method for the semiconductor unit in accordance with the first embodiment of the present invention.
Figure 2F:
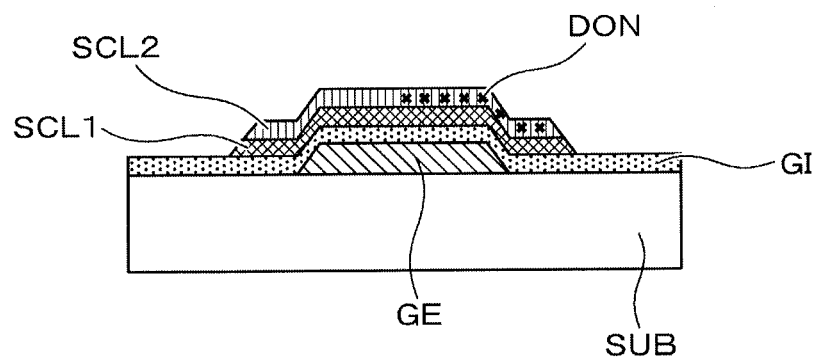
FIG. 2F is a sectional view showing the manufacturing method for the semiconductor unit in accordance with the first embodiment of the present invention.

Thereafter, a halftone mask is used to expose the photoresist PR in two shades, and an unnecessary part of the photoresist PR is removed. When a positive resist is used, a fully exposed part is completely removed, and the photoresist PR of a half exposed part is thinned (FIG. 2B). The photoresist PR is used as a mask, and a wet etching solution made of acid is used to process the semiconductor layer 1 SCL1 and semiconductor layer 2 SCL2. Thereafter, the photoresist PR is thinned, and the photoresist PR in the half exposed area is removed (FIG. 2C and FIG. 2D). Thereafter, a donor DON is produced in the exposed part of the semiconductor layer 2 SCL2 by performing such treatment as exposure of the semiconductor layer to plasma of argon, sulfur hexafluoride ($SF_6$), nitrogen or the like or to hydrogen atmosphere, or injection of hydrogen ions to the exposed part. Thus, the carrier concentration in the region is raised in order to lower the resistivity (FIG. 2E). Thereafter, the photoresist is completely removed (FIG. 2F).

Figure 2G:
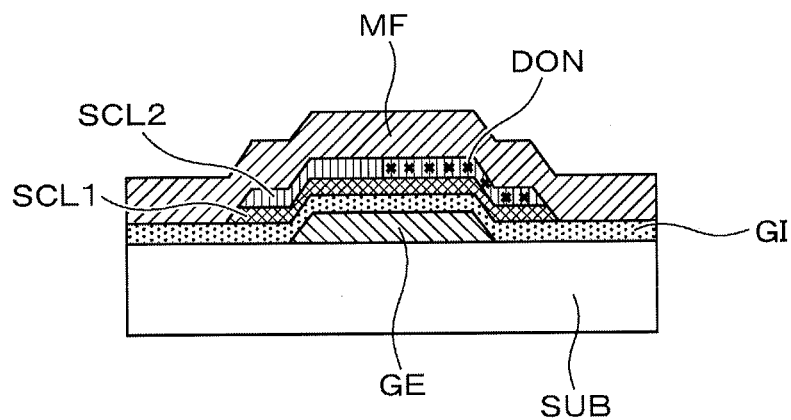
FIG. 2G is a sectional view showing the manufacturing method for the semiconductor unit in accordance with the first embodiment of the present invention.
Figure 2H:
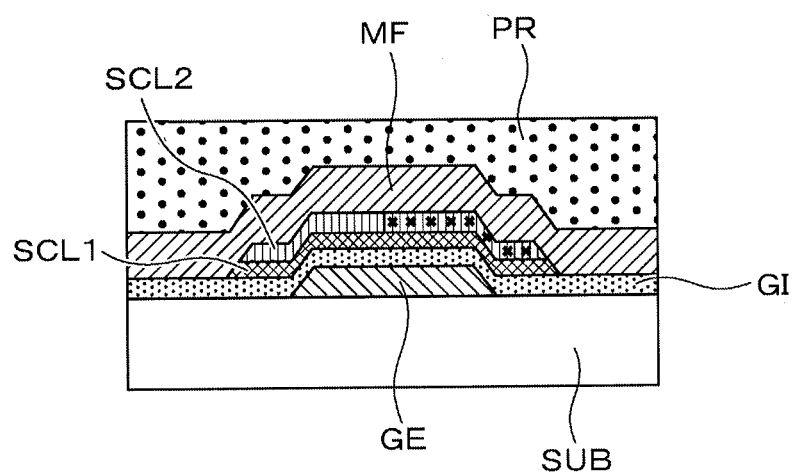
FIG. 2H is a sectional view showing the manufacturing method for the semiconductor unit in accordance with the first embodiment of the present invention.
Figure 2I:
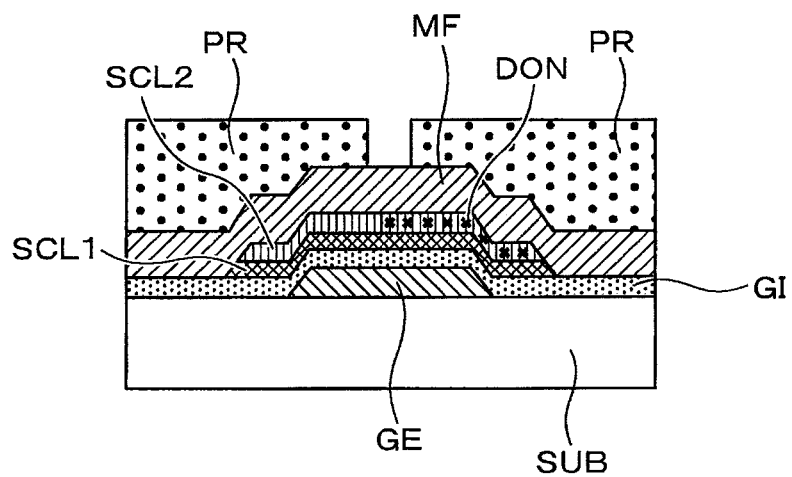
FIG. 2I is a sectional view showing the manufacturing method for the semiconductor unit in accordance with the first embodiment of the present invention.
Figure 2J:
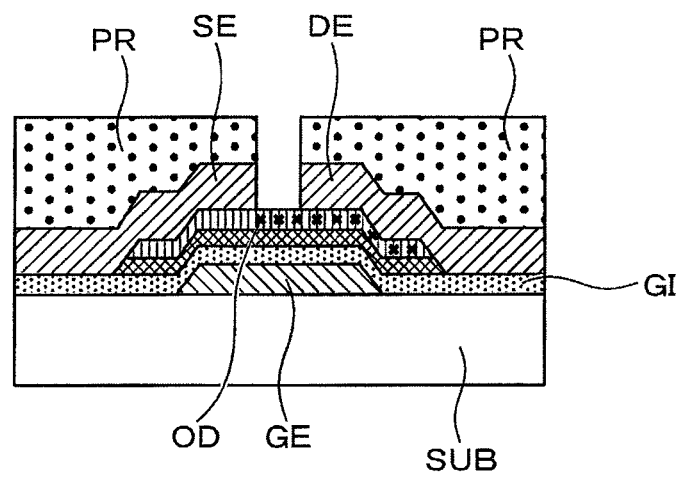
FIG. 2J is a sectional view showing the manufacturing method for the semiconductor unit in accordance with the first embodiment of the present invention.

Thereafter, a metallic film MF is formed on the semiconductor layer 2 SCL2 (FIG. 2G). The metallic film MF is formed with, for example, a single film made of molybdenum, chromium, tungsten, aluminum, copper, titanium, nickel, tantalum, silver, zinc, or any other metal, an alloy film made of any of the metals, or a laminated film formed with any of the single films, a metal oxide conductive film made of ITO (indium tin oxide (In—Sn—O)), a laminated film formed with the conductive film and any metal, a metal nitride conductive film made of titanium nitride (Ti—N), a laminated film formed with the metal nitride conductive film and any metal, a compound film made of any other conductive metal or a laminated film formed with the compound film and any metal, or a semiconductor containing carriers at a high concentration or a laminated film formed with the semiconductor and any metal. Thereafter, the photoresist PR is coated over the metallic film MF, and the metallic film MF is processed to be shaped as a source electrode SE and drain electrode DE using a combination of typical photolithographic technology and dry etching (FIG. 2H to FIG. 2J). At this time, since the semiconductor layer 2 SCL2 in an opening between the source electrode SE and drain electrode DE is exposed to plasma or accelerated particles, oxygen deficiency OD is produced. The carrier concentration in that part is raised.

Figure 2K:
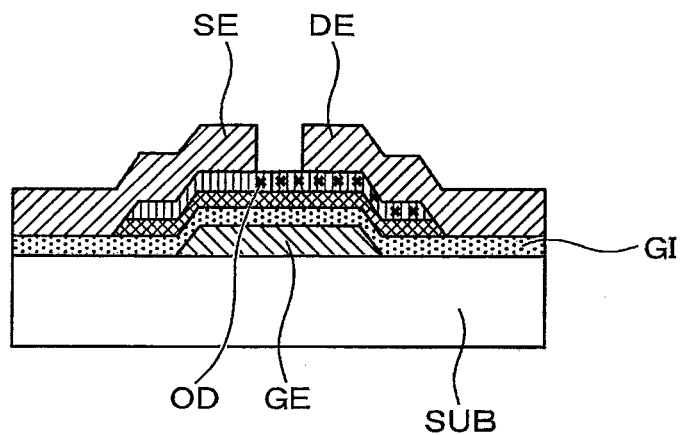
FIG. 2K is a sectional view showing the manufacturing method for the semiconductor unit in accordance with the first embodiment of the present invention.
Figure 2L:
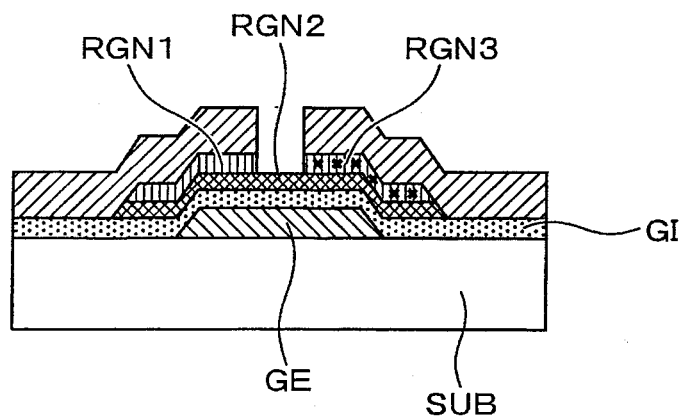
FIG. 2L is a sectional view showing the manufacturing method for the semiconductor unit in accordance with the first embodiment of the present invention.

Finally, after the photoresist PR is removed, the exposed part of the semiconductor layer 2 SCL2 is removed through wet etching that employs an etching solution made of acid (FIG. 2K to FIG. 2L). At this time, since the etch rate of the semiconductor layer 1 SCL1 is much smaller than the etch rate of the semiconductor layer 2 SCL2, the wet etching is autonomously ceased on the surface of the semiconductor layer 1 SCL1. Substantially, no decrease occurs in the film thickness of the semiconductor layer 1 SCL1 due to the wet etching.

In the structure shown in FIG. 1, the resistivity of the third region RGN3 is small. Therefore, a contact resistance Rdc between the semiconductor layer and drain electrode DE is smaller than that in the structure disclosed in Patent Literature 1. In other words, if the formula (1) is adopted, an on current is increased. According to the manufacturing method of FIG. 2, since the carrier concentrations (that is, resistivities) of the first region RGN1 and second region RGN2 are not changed by the resistivity lowing treatment of the third region RGN3, Vth or an off current is not degraded.

Figure 3:
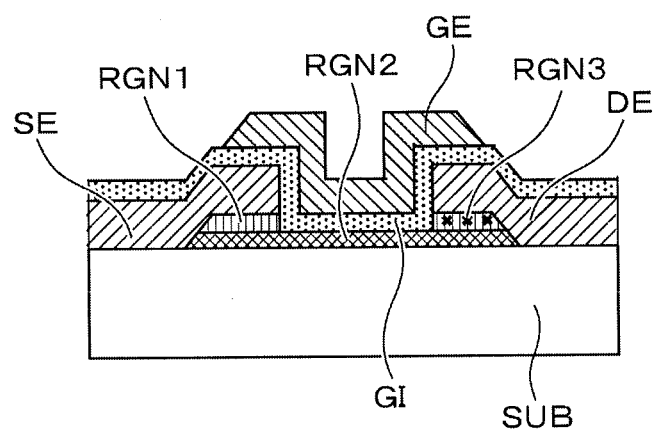
FIG. 3 is a sectional view showing another constitution of the semiconductor unit in accordance with the first embodiment of the present invention.

FIG. 3 is a diagram showing another constitution of a thin-film transistor in accordance with the first embodiment. As the thin-film transistor, a so-called top gate/top contact oxide TFT is cited. The thin-film transistor is different from the one shown in FIG. 1 and FIG. 2 in the positions of a gate electrode and gate insulating film. However, an advantage provided by the present invention is identical. The manufacturing method can be easily inferred from FIG. 2. An iterative description will therefore be omitted.

According to the first embodiment, in a TFT that adopts an oxide semiconductor as a channel layer, Vth close to 0 V, a small off current, and a large on current can be attained concurrently.

In the present specification, an electrode to be connected with the first region RGN1 of a high resistivity is referred to as the source electrode SE, and an electrode to be connected with the third region RGN3 of a low resistivity is referred to as the drain electrode. Alternatively, the reverse will do.

Advantageous effects of the device shown in FIG. 3: in the structure of FIG. 3, since a current is fed to an upper film layer of high film quality and high conductivity in the second region RGN2, an advantageous effect that a large current can be readily obtained is expected. Since many defects are introduced in an early stage of film formation of an oxide semiconductor, the film quality may be degraded, though it depends on a film formation method. In the structure of FIG. 3, a gate insulating film that governs the reliability of a device is formed on the oxide semiconductor layer. Therefore, damage hardly occurs in an interface that abuts on the oxide semiconductor. An advantageous effect that reliability can be readily upgraded can be expected. In the structure, which has the oxide semiconductor formed on the gate insulating film, like the one shown in FIG. 1, the surface of the gate insulating film may be damaged due to accelerated particles or plasma occurring when the oxide semiconductor is formed.

Second Embodiment

Figure 4:
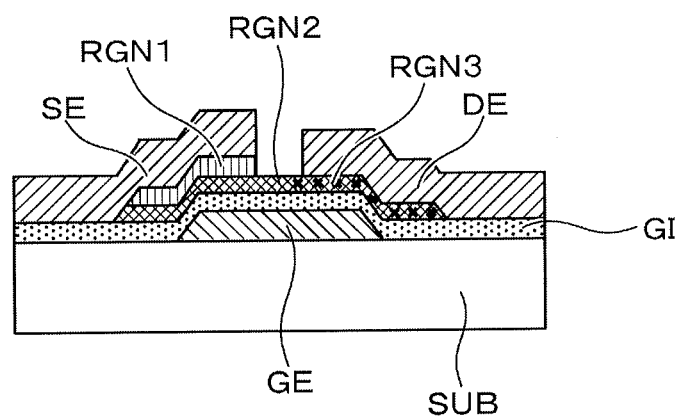
FIG. 4 is a sectional view showing another constitution of a semiconductor unit in accordance with a second embodiment of the present invention.

FIG. 4 is a diagram showing a constitution of a thin-film transistor in accordance with a second embodiment. As the thin-film transistor, a so-called bottom gate/top contact oxide TFT is cited.

In a semiconductor layer that links a source electrode and drain electrode, three regions of a first region RGN1, second region RGN2, and third region RGN3 are included. The first region RGN1 is connected with the source electrode, the third region RGN3 is connected with the drain electrode, and the second region RGN2 is connected between the first region RGN1 and third region RGN3. The second region RGN2 and third region RGN3 are formed with the same oxide semiconductor film, and the third region RGN3 is formed by performing resistivity lowering treatment on the film. The first region RGN1 is formed on the second region RGN2 using another oxide semiconductor film. The resistivities of the three regions have the relationship of the first region RGN1>the second region RGN2>the third region RGN3. As for the resistivities, more particularly, the resistivity of the first region RGN1 is equal to or higher than $10^1$ Ωcm and falls below $10^7$ Ωcm, the resistivity of the second region RGN2 is equal to or higher than $10^{-3}$ Ωcm and falls below $10^2$ Ωcm, and the resistivity of the third region RGN3 falls below the resistivity of the second region RGN2. Alternatively, the regions may be specified with carrier concentrations. In this case, the carrier concentration of the first region RGN1 is equal to or higher than $10^{12}$ cm$^{-3}$ and falls below $10^{18}$ cm$^{-3}$, the carrier concentration of the second region RGN2 is equal to or higher than $10^{16}$ cm$^{-3}$ and falls below $10^{21}$ cm$^{-3}$, and the carrier concentration of the third region RGN3 is larger than that of the second region RGN2.

In the semiconductor device shown in FIG. 4, when electrons travel from RGN1 through RGN2 to RGN3, the traveling distance of the electrons is shorter than that in the structure of FIG. 1. Therefore, a voltage drop is diminished and an on current is improved. In addition, since RGN1 and RGN3 are formed with different films, a material to be applied to RGN1 can be determined without the necessity of taking account of an adverse effect on RGN3. For example, a material from which oxygen $O_2$ cannot be readily drawn out can be applied. In short, the range of options of the material to be applied to RGN1 is expanded.

Figure 5A:
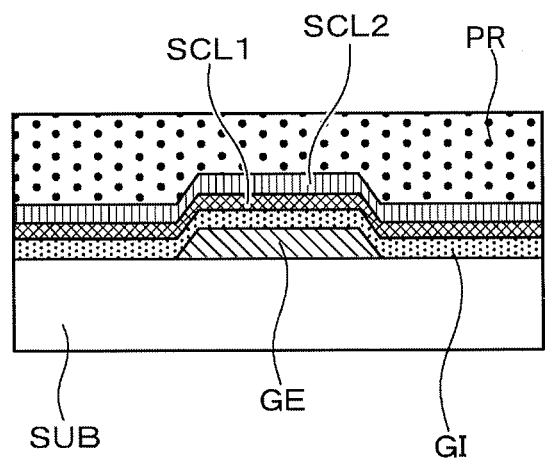
FIG. 5A is a sectional view showing a manufacturing method for the semiconductor unit in accordance with the second embodiment of the present invention.

FIG. 5A to FIG. 5L are diagrams showing a manufacturing method for a semiconductor unit in accordance with the second embodiment. To begin with, a gate electrode GE, gate insulating film GI, semiconductor layer 1 SCL1, semiconductor layer 2 SCL2, and photoresist PR are formed on an insulator substrate SUB (FIG. 5A). The semiconductor layer 1 SCL1 and semiconductor layer 2 SCL2 are made of an oxide of any of Zn, In, Ga, and Sn such as Zn—O, In—O, Ga—O, Sn—O, In—Ga—Zn—O, Zn—Sn—O, In—Sn—O, In—Zn—O, Ga—Zn—O, In—Ga—O, or Al—Zn—O, or a complex oxide composed of any of the oxides. As a combination of the semiconductor layer 1 SCL1 and semiconductor layer 2 SCL2, various combinations of any of the materials are conceivable. For example, a combination of the semiconductor layer 1 SCL1 made of In—Sn—O and the semiconductor layer 2 SCL2 made of either In—Ga—Zn—O or Zn—O is preferred.

Figure 5B:
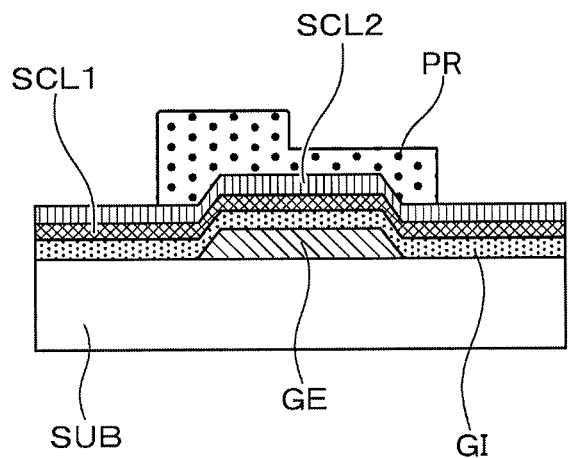
FIG. 5B is a sectional view showing the manufacturing method for the semiconductor unit in accordance with the second embodiment of the present invention.
Figure 5C:
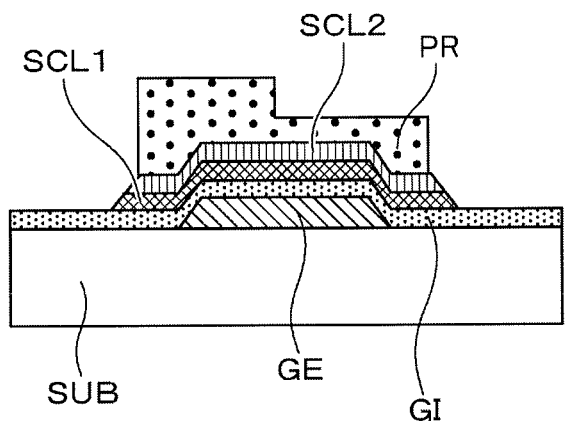
FIG. 5C is a sectional view showing the manufacturing method for the semiconductor unit in accordance with the second embodiment of the present invention.
Figure 5D:
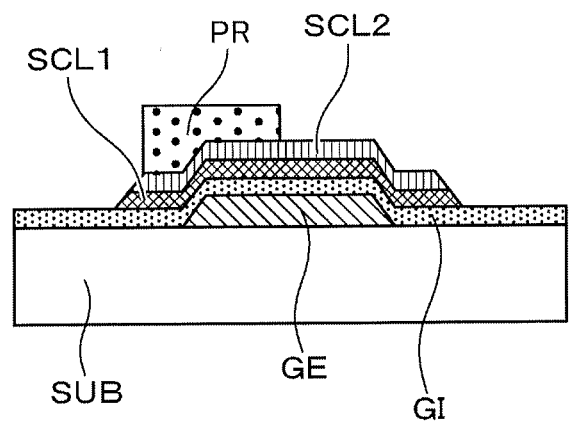
FIG. 5D is a sectional view showing the manufacturing method for the semiconductor unit in accordance with the second embodiment of the present invention.
Figure 5E:
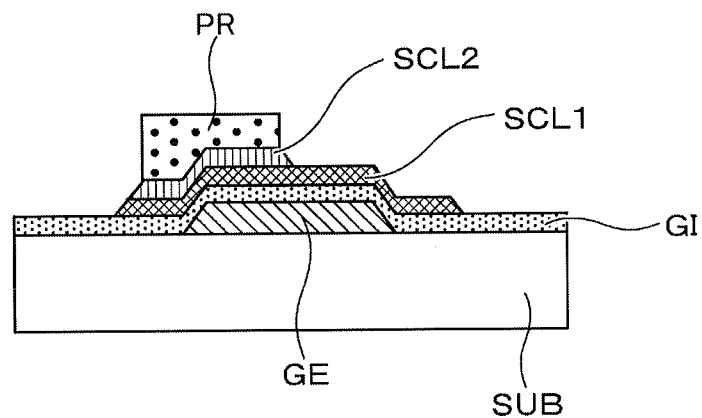
FIG. 5E is a sectional view showing the manufacturing method for the semiconductor unit in accordance with the second embodiment of the present invention.
Figure 5F:
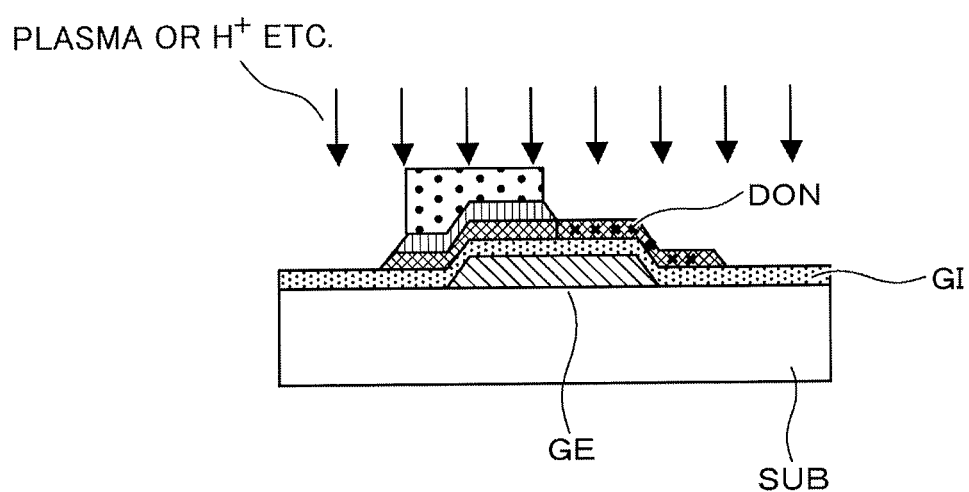
FIG. 5F is a sectional view showing the manufacturing method for the semiconductor unit in accordance with the second embodiment of the present invention.
Figure 5G:
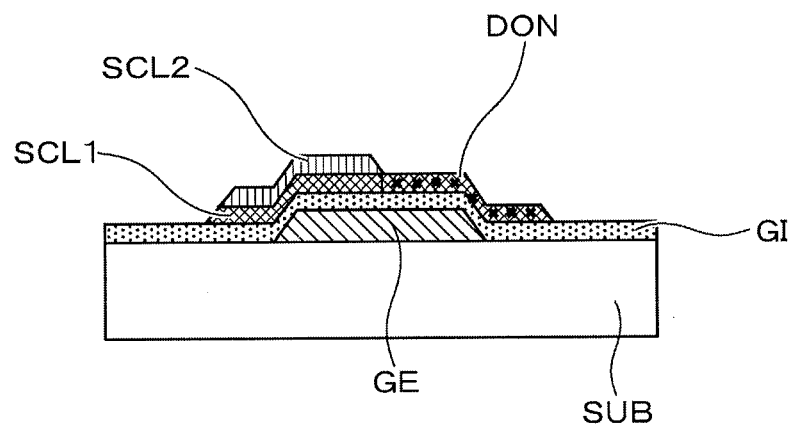
FIG. 5G is a sectional view showing the manufacturing method for the semiconductor unit in accordance with the second embodiment of the present invention.

Thereafter, a halftone mask is used to expose the photoresist PR in two shades, and an unnecessary part of the photoresist PR is thus removed. When a positive resist is employed, a fully exposed part is completely removed and the photoresist PR of a half exposed part is thinned (FIG. 5B). After the semiconductor layer 1 and semiconductor layer 2 are processed using a wet etching solution made of acid, the photoresist PR is thinned, and the photoresist PR in the half exposed region is removed (FIG. 5C and FIG. 5D). Thereafter, the wet etching solution made of acid is used to remove the exposed part of the semiconductor layer 1 (FIG. 5E). Thereafter, a donor DON is produced in the exposed part of the semiconductor layer 1 SCL1 by performing such treatment as exposure of the semiconductor layer 1 to plasma of argon, sulfur hexafluoride ($SF_6$), nitrogen, or the like or to hydrogen atmosphere, or injection of hydrogen ions to the exposed part. Thus, the carrier concentration in this region is raised and the resistivity thereof is lowered (FIG. 5F). Thereafter, the photoresist is completely removed (FIG. 5G).

Figure 5H:
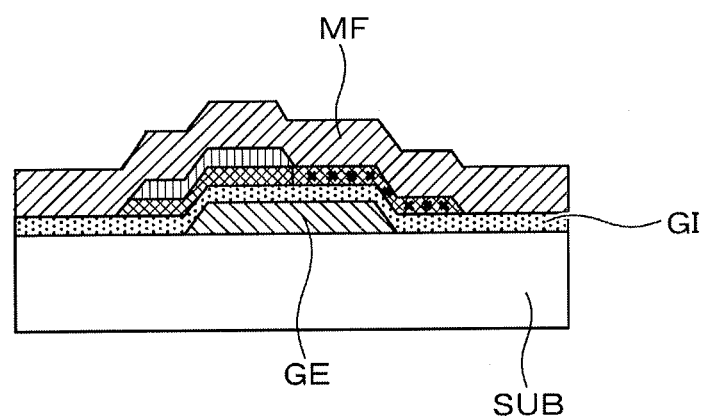
FIG. 5H is a sectional view showing the manufacturing method for the semiconductor unit in accordance with the second embodiment of the present invention.
Figure 5I:
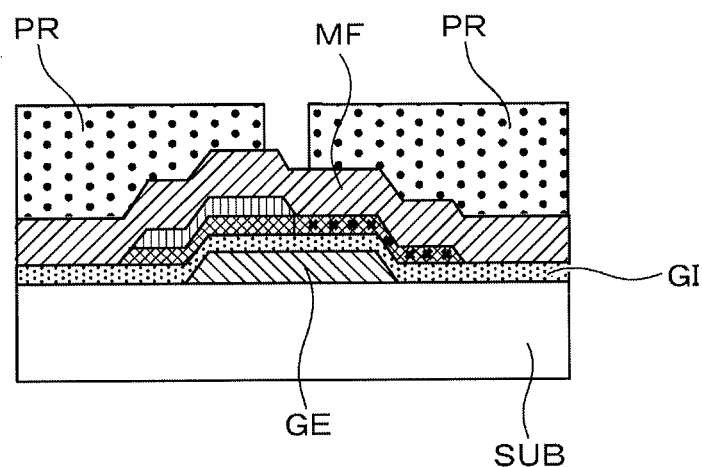
FIG. 5I is a sectional view showing the manufacturing method for the semiconductor unit in accordance with the second embodiment of the present invention.
Figure 5J:
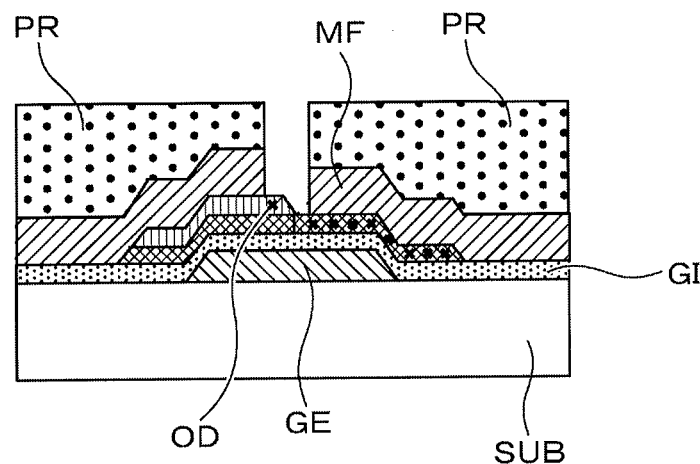
FIG. 5J is a sectional view showing the manufacturing method for the semiconductor unit in accordance with the second embodiment of the present invention.

Thereafter, a metallic film MF is formed on the semiconductor layer 1 SCL1 and semiconductor layer 2 SCL2. Thereafter, the photoresist PR is coated over the metallic film, and the metallic film MF is processed to be shaped as a source electrode SE and drain electrode DE using a combination of typical photolithographic technology and dry etching (FIG. 5H to FIG. 5J). At this time, since the semiconductor layer 1 SCL1 and semiconductor layer 2 SCL2 in an opening between the source electrode SE and drain electrode DE are exposed to plasma and accelerated particles, oxygen deficiency OD is produced. The carrier concentration of that part is therefore raised.

Figure 5K:
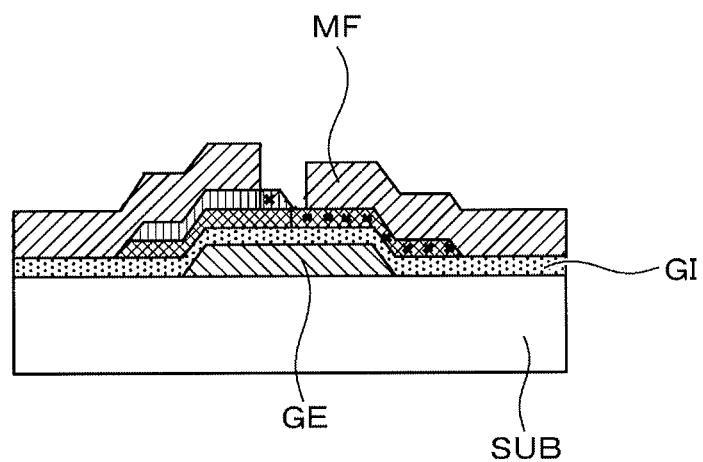
FIG. 5K is a sectional view showing the manufacturing method for the semiconductor unit in accordance with the second embodiment of the present invention.
Figure 5L:
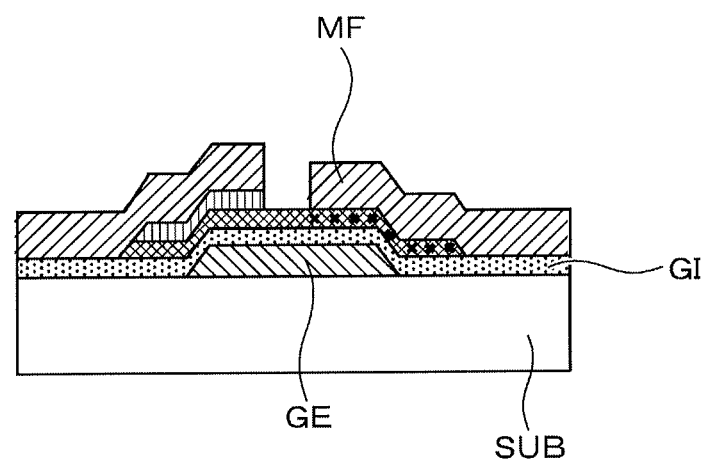
FIG. 5L is a sectional view showing the manufacturing method for the semiconductor unit in accordance with the second embodiment of the present invention.

Finally, after the photoresist PR is removed, the exposed part of the semiconductor layer 2 SCL2 is removed through wet etching that employs an etching solution made of acid (FIG. 5K to FIG. 5L). At this time, since the etch rate of the semiconductor layer 1 SCL1 is much smaller than the etch rate of the semiconductor layer 2 SCL2, the wet etching is autonomously ceased on the surface of the semiconductor layer 1 SCL1. Substantially, no decrease occurs in the film thickness of the semiconductor layer 1 SCL1 due to the wet etching.

In the structure of FIG. 4, since the resistivity of the third region RGN3 is diminished, a contact resistance Rdc between the semiconductor layer and drain electrode DE is smaller than that in the structure disclosed in Patent Literature 1. Namely, if the formula (1) is adopted, an on current is increased. According to the manufacturing method of FIG. 5, since the carrier concentrations (that is, the resistivities) of the first region RGN1 and second region RGN2 are not changed through the resistivity lowering treatment of the third region RGN3, Vth and an off current are not degraded.

Figure 6:
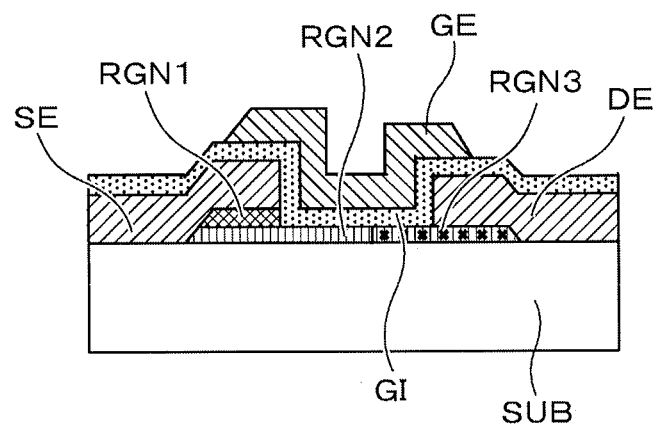
FIG. 6 is a sectional view showing another constitution of the semiconductor unit in accordance with the second embodiment of the present invention.

FIG. 6 is another diagram showing a constitution of a thin-film transistor in accordance with the second embodiment. As the thin-film transistor, a so-called top gate/top contact oxide TFT is cited. The constitution is different from that in FIG. 4 and FIG. 5 in the positions of a gate electrode and gate insulating film. However, an advantage provided by the present invention is identical. The manufacturing method can be readily inferred from FIG. 5. An iterative description will therefore be omitted.

According to the second embodiment, in a TFT that adopts an oxide semiconductor as a channel layer, Vth close to 0 V, a low off current, and a high on current can be attained concurrently.

A semiconductor unit shown in FIG. 6 has both the advantages shown in FIG. 3 and FIG. 4.

In the description of the second embodiment, an iterative description of a portion shared with the first embodiment has been avoided except that of an indispensable portion.

Third Embodiment

Figure 7:
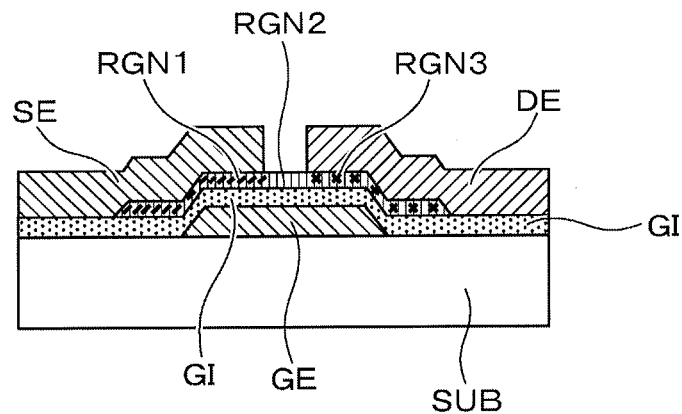
FIG. 7 is a sectional view showing a constitution of a semiconductor unit in accordance with a third embodiment of the present invention.
Figure 8:
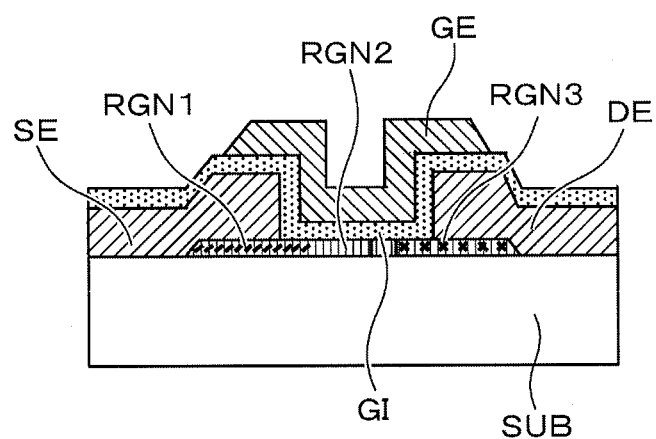
FIG. 8 is a sectional view showing another constitution of the semiconductor unit in accordance with the third embodiment of the present invention.

FIG. 7 and FIG. 8 are diagrams showing a constitution of a thin-film transistor in accordance with a third embodiment. In FIG. 7, a so-called bottom gate/top contact oxide TFT is cited as the thin-film transistor. In FIG. 8, a top gate/top contact TFT is cited. A difference from the second embodiment lies in a point that a first region RGN1 is formed by raising the resistivity of part of a semiconductor layer 1 SCL1. Specifically, the first region RGN1, a second region RGN2, and a third region RGN3 are formed from the semiconductor layer 1 SCL1. Raising the resistivity of the semiconductor layer 1 SCL1 is achieved by oxidizing the semiconductor layer 1 according to a method of treating the semiconductor layer 1 in plasma of oxygen or nitrogen dioxide ($N_2O$) or any other oxygen-containing gas or a method of performing annealing treatment in oxygen atmosphere.

A semiconductor unit shown in FIG. 7 does not require the two layers of the semiconductor layer 1 SCL1 and semiconductor layer 2 SCL2 described in the first and second embodiments, but includes only the semiconductor layer 1 SCL1. This provides an advantage that one film forming step can be omitted. In addition, according to the structure, compared with the structure of FIG. 1 or FIG. 4, a distance which electrons travel can be shortened. This brings about an advantage that a total resistance is decreased and a current value is readily increased.

A semiconductor unit shown in FIG. 8 has the advantages of the semiconductor devices shown in FIG. 3 and FIG. 7.

Fourth Embodiment

Figure 9:
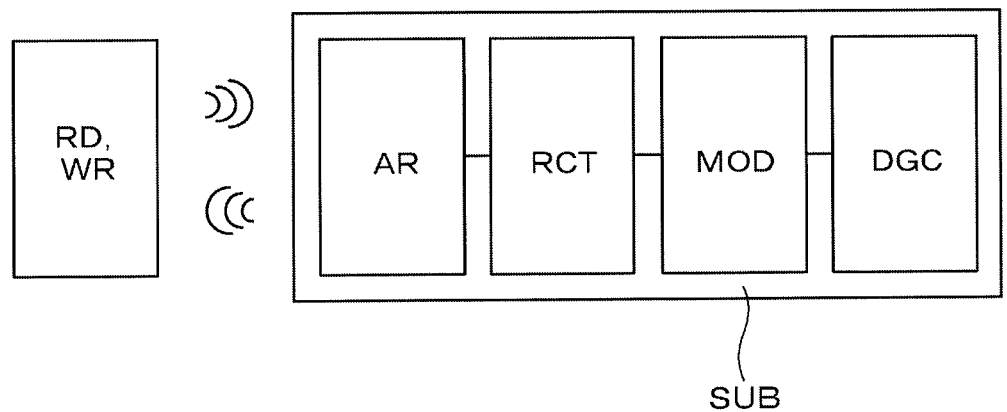
FIG. 9 is a block diagram showing a constitution of a semiconductor unit (wireless tag) in accordance with a fourth embodiment of the present invention.

FIG. 9 is a diagram showing a constitution of a semiconductor unit in accordance with a third embodiment. A TFT having the structure shown in any of the first to third embodiments is used to constitute an antenna resonance circuit AR, rectifier RCT, modulator MOD, and digital circuit DGC, whereby a wireless tag is formed. The wireless tag can wirelessly communicate with a reader RD or writer WR.

Fifth Embodiment

Figure 10:
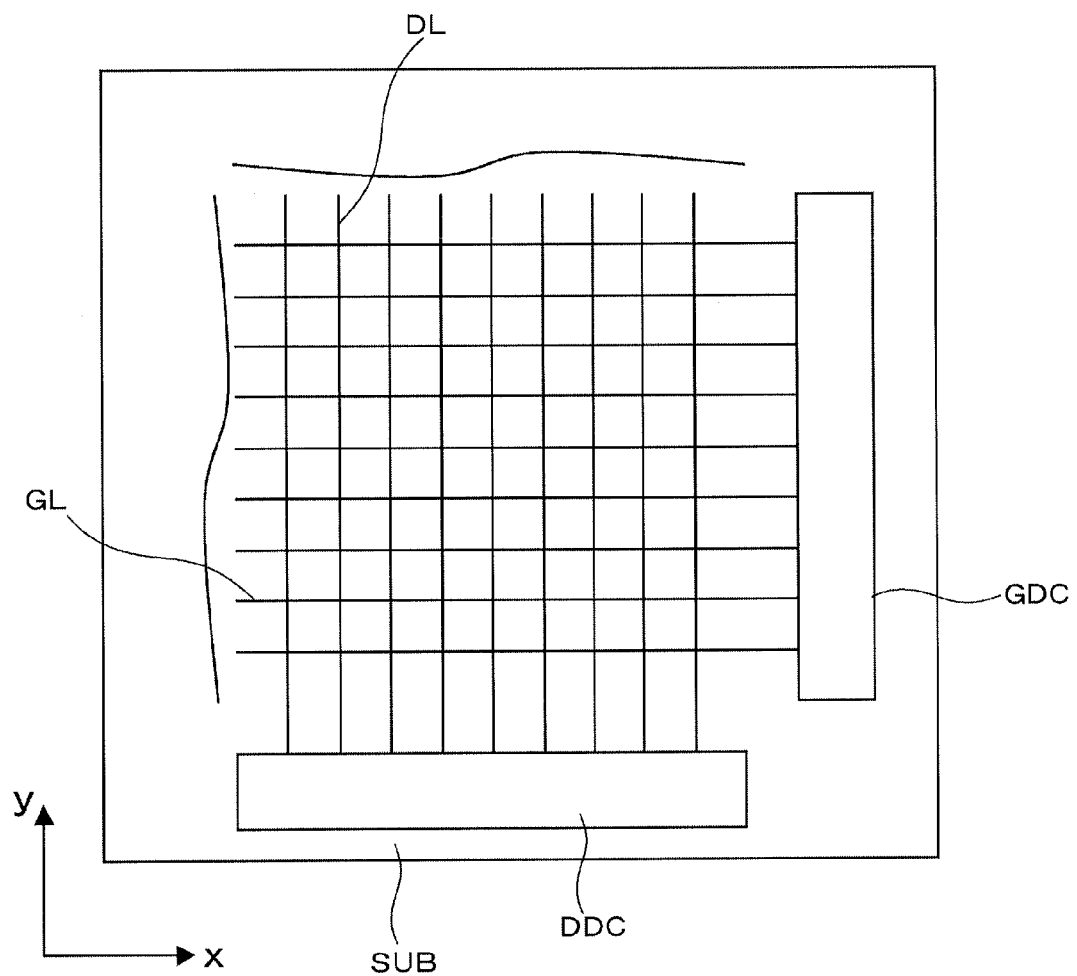
FIG. 10 is a schematic diagram showing a constitution of a semiconductor unit in accordance with a fifth embodiment of the present invention.

FIG. 10 is a diagram showing a constitution of a semiconductor unit in accordance with a fifth embodiment. In the fifth embodiment, elements each having a TFT, which has the structure of any of the first to third embodiments, as a component are set in array on a substrate SUB. The TFT in accordance with any of the first to third embodiments may be adopted not only as a transistor for switching or driving each of the elements in the array but also as a transistor included in a gate line drive circuit GDC, which transmits a signal onto a gate line GL coupled to the gate electrodes GE of TFTs, or a transistor included in a data line drive circuit DDC which transmits a signal onto a data line DL coupled to the source electrodes SE or drain electrodes DE of the TFTs. In this case, the TFTs in the respective elements and the TFTs included in the gate line drive circuit GDC or data line drive circuit DDC can be formed concurrently.

Figure 11:
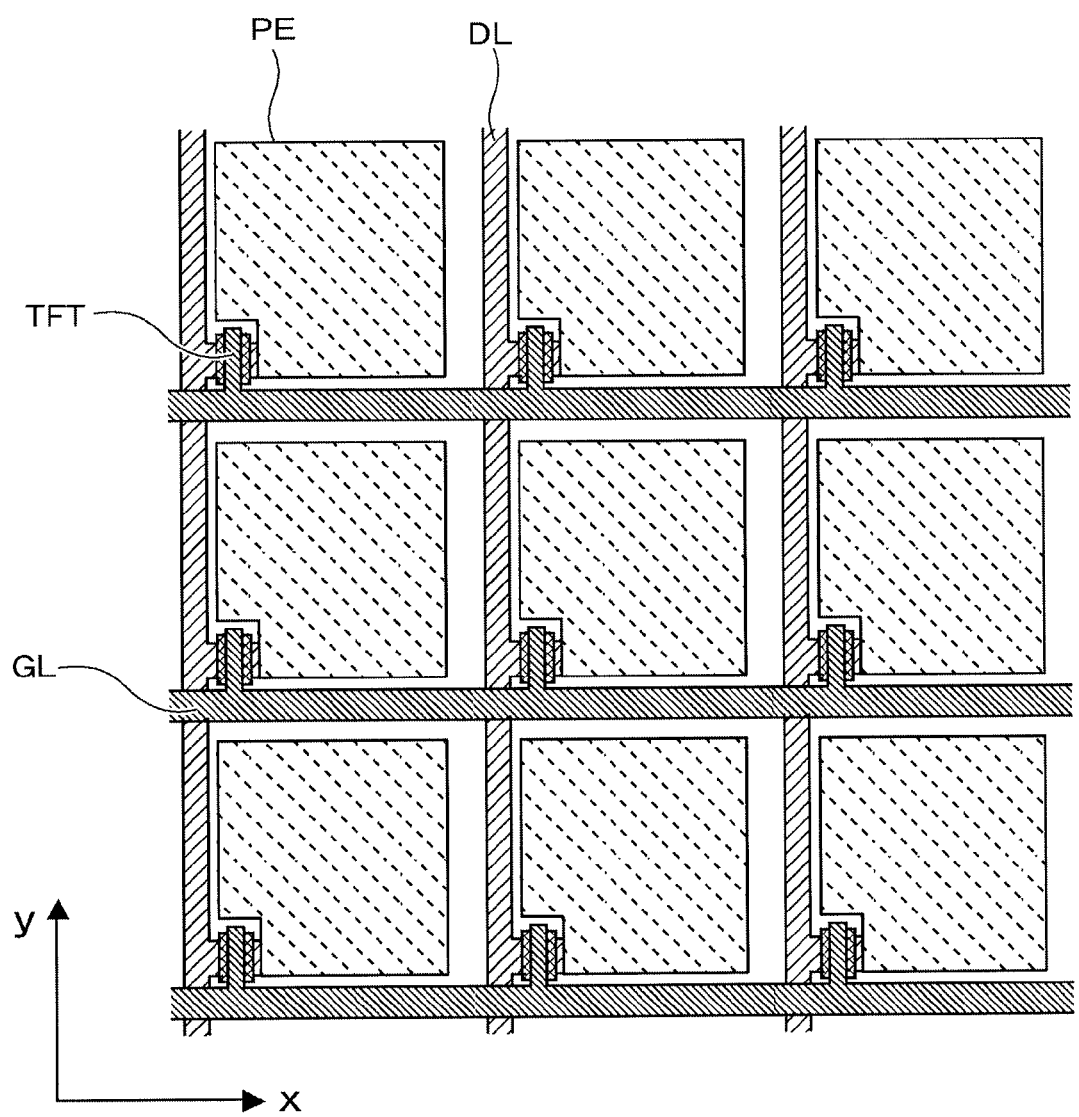
FIG. 11 is a schematic diagram showing the constitution of the semiconductor unit in accordance with the fifth embodiment of the present invention adapted to an active matrix liquid crystal display.
Figure 12:
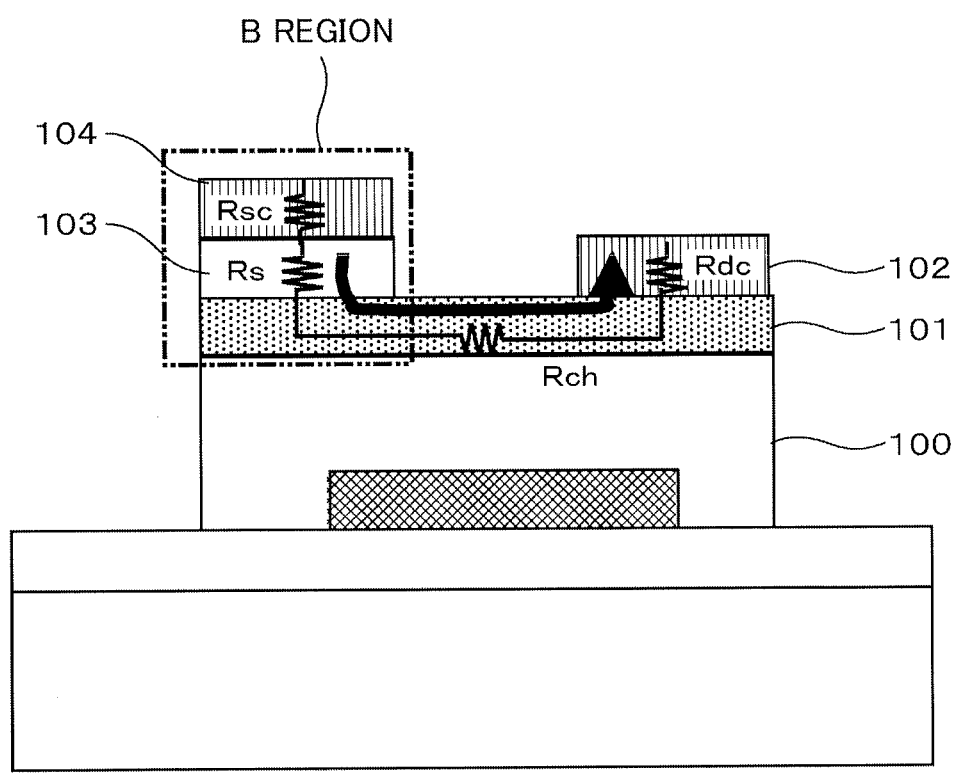
FIG. 12 is a schematic diagram showing resistive components of each of regions of a semiconductor unit in accordance with an embodiment of the present invention.

Assuming that the foregoing array is adapted to an active matrix liquid crystal display, the elements are constituted as shown in, for example, FIG. 11. When a scan signal is fed to a gate line GL extending in an x direction in the drawing, TFTs are turned on. Video signals sent over data lines DL, which extend in a y direction in the drawing, are fed to pixel electrodes PE through the TFTs that are turned on. The gate lines GL are juxtaposed in the y direction in the drawing, and the data lines DL are juxtaposed in the x direction in the drawing. Each of the pixel electrodes PE is disposed in an area (pixel area) enclosed with a pair of adjoining gate lines GL and a pair of adjoining drain lines DL. In this case, for example, the data lines DL are electrically coupled to the source electrodes SE, and the pixel electrodes PE are electrically connected to the drain electrodes DE. Alternatively, the data lines DL may serve as the source electrodes SE. Further, the aforesaid array is not limited to the liquid crystal display but may be adapted to an organic electroluminescent display. In this case, the TFTs are adapted to transistors constituting a pixel circuit. Further, the aforesaid array may be adapted to a storage element, and the TFTs may be adapted to selection transistors.

The invention made by the present inventor has been concretely described based on the embodiments. However, the present invention is not limited to the embodiments but can be modified in various manners without a departure from the gist.

INDUSTRIAL APPLICABILITY

A semiconductor unit in accordance with the present invention can be adapted to transistors constituting a wireless tag, storage-element array, or the like, or a peripheral circuit. In addition, the semiconductor unit can be adapted to transistors that drive pixels included in a transmissive, reflective, or semi-transmissive liquid crystal display or an organic electroluminescent display, or a periphery circuit.

REFERENCE SIGNS LIST

AR: antenna resonance circuit,
CL: conductive layer,
DDC: data line drive circuit,
DE: drain electrode,
DGC: digital circuit,
DL: data line,
DON: donor,
DR: damage region,
ESL: etch stopper layer,
GDC: gate line drive circuit,
GE: gate electrode,
GI: gate insulating film,
GL: gate line,
MF: metallic film,
MOD: modulator,
OD: oxygen deficiency,
PE: pixel electrode,
PR: photoresist,
RCT: rectifier,
RD: reader,
RGN1: semiconductor region 1,
RGN2: semiconductor region 2,
RGN3: semiconductor region 3,
SCL1: semiconductor layer 1,
SCL2: semiconductor layer 2,
SE: source electrode,
SL: sacrifice layer,
SUB: substrate,
TFT: oxide TFT,
WR: writer.

The invention claimed is:

1. A thin-film transistor including a semiconductor layer that links a source electrode and a drain electrode, a gate insulating film formed to abut on the principal surface of the semiconductor layer, and a gate electrode formed to abut on a surface opposite to the surface of the gate insulating film that abuts on the semiconductor layer,
   wherein the semiconductor layer is made of a metal oxide and includes three regions of a first region, second region, and third region;
   the first region is connected with the source electrode, the third region is connected with the drain electrode, and the second region is connected between the first region and third region; and
   the resistivities of the three regions have the relationship of the resistivity of the first region>the resistivity of the second region>the resistivity of the third region.

2. The thin-film transistor according to claim 1,
   wherein the semiconductor layer includes a first semiconductor layer, a second semiconductor layer stacked on a partial region of the first semiconductor layer, and a third semiconductor layer stacked on another partial region of the first semiconductor layer;

the first region is formed with the second semiconductor layer;

the third region is formed with the third semiconductor layer;

the second region is formed with the first semiconductor layer; and the third semiconductor layer is disposed apart from the second semiconductor layer, made of the same material as the second semiconductor layer is, and has the material subjected to resistance lowering treatment.

3. The thin-film transistor according to claim 1, wherein the semiconductor layer includes a first semiconductor layer and a second semiconductor layer stacked on a partial region of the first semiconductor layer;

the first region is formed with the second semiconductor layer;

the third region is formed with the partial region of the first semiconductor layer that has undergone resistance lowering treatment; and the second region is formed with another partial region of the first semiconductor layer that has not undergone the resistance lowering treatment.

4. The thin-film transistor according to claim 1, wherein a region of the semiconductor layer that has undergone resistivity raising treatment forms the first region;

a region of the semiconductor layer that has undergone resistivity lowering treatment forms the third region; and a region of the semiconductor layer that has undergone neither resistivity raising treatment nor resistivity lowering treatment forms the second region.

5. The thin-film transistor according to claim 1, wherein the resistivity of the first region is equal to or higher than $10^1$ Ωcm and falls below $10^7$ Ωcm; and the resistivity of the second region is equal to or higher than $10^{-3}$ Ωcm and falls below $10^2$ Ωcm.

6. The thin-film transistor according to claim 1, wherein the carrier concentration of the first region is equal to or higher than $10^{12}$ cm$^{-3}$ and falls below $10^{18}$ cm$^{-3}$; and the carrier concentration of the second region is equal to or higher than $10^{16}$ cm$^{-3}$ and falls below $10^{21}$ cm$^{-3}$.

7. A manufacturing method for a thin-film transistor comprising:

a step of forming a gate electrode on a substrate;

a step of sequentially stacking a gate insulating film, a first semiconductor film, and a second semiconductor film on the gate electrode and the surface of the substrate;

a step of processing the first semiconductor film into a desired shape so as to cover the gate electrode, and processing the second semiconductor film so that the second semiconductor film includes two separate regions;

a step of lowering the resistivity of one of the separate regions of the second semiconductor film through donor introduction treatment, and thus forming two regions of different resistivities, that is, a region of a high carrier concentration which has the second semiconductor film subjected to resistivity lowering treatment and a region of a low carrier concentration which has not undergone the resistivity lowering treatment; and a step of forming a first electrode and a second electrode that are connected with the region which has undergone the resistivity lowering treatment and the region which has not undergone the resistivity lowering processing, respectively.

8. The manufacturing method for a thin-film transistor according to in claim 7, wherein the donor treatment is achieved using treatment of coating a part of the second semiconductor film with a photoresist, and exposing a bared part of the semiconductor film, which is not coated with the photoresist, to plasma of argon, sulfur hexafluoride (SF$_6$), nitride, hydrogen atmosphere, or treatment of injecting hydrogen ions to the bared part.

9. The manufacturing method for a thin-film transistor according to claim 7, wherein the step of forming the first electrode and second electrode includes a step of forming a metallic film on the second semiconductor film, processing the metallic film into the shapes of the first electrode and second electrode according to a photolithographic technique, and removing the second semiconductor film, which is not coated with the first electrode and second electrode, through wet etching.

10. The manufacturing method for a thin-film transistor according to claim 7, wherein the manufacturing method further comprises a step in which when the first semiconductor film and second semiconductor film are formed, tin (Sn) of a higher concentration than that in the second semiconductor film is contained in the first semiconductor film.

11. A manufacturing method for a thin-film transistor comprising:

a step of forming a gate electrode on a substrate;

a step of sequentially stacking a gate insulating film, a first semiconductor film, and a second semiconductor film having a higher resistivity than the first semiconductor film on the gate electrode and the surface of the substrate;

a step of processing the first semiconductor film into a desired shape so as to cover the gate electrode, and performing processing so that the second semiconductor film is formed on a partial region of the first semiconductor film;

a step of lowering the resistivity of the partial region of the first semiconductor film through donor introduction treatment, and thus forming two regions of different resistivities, that is, a region of a high carrier concentration which has the first semiconductor film subjected to resistivity lowering treatment and a region of a low carrier concentration which has not undergone the resistivity lowering treatment; and a step of forming a first electrode and a second electrode that are connected with the region, which has undergone the resistivity lowering treatment, and the second semiconductor film respectively.

* * * * *